US006653174B1

United States Patent
Cho et al.

(10) Patent No.: US 6,653,174 B1
(45) Date of Patent: Nov. 25, 2003

(54) THYRISTOR-BASED DEVICE OVER SUBSTRATE SURFACE

(75) Inventors: Hyun-Jin Cho, Palo Alto, CA (US); Andrew Horch, Mountain View, CA (US); Scott Robins, San Jose, CA (US); Farid Nemati, Menlo Park, CA (US)

(73) Assignee: T-RAM, Inc., San Jose, CA (US)

( * ) Notice: Subject to any disclaimer, the term of this patent is extended or adjusted under 35 U.S.C. 154(b) by 0 days.

(21) Appl. No.: 10/023,052

(22) Filed: Dec. 17, 2001

Related U.S. Application Data

(63) Continuation of application No. 09/666,825, filed on Sep. 21, 2000, now Pat. No. 6,448,586, which is a continuation of application No. 09/092,449, filed on Jun. 5, 1998, now Pat. No. 6,229,161.

(51) Int. Cl.[7] ............................................. H01L 21/332
(52) U.S. Cl. ........................ 438/133; 438/135; 257/133
(58) Field of Search ................. 438/133, 135; 257/107, 133

(56) References Cited

U.S. PATENT DOCUMENTS

| | | |
|---|---|---|
| 3,918,033 A | 11/1975 | Case et al. |
| 3,986,177 A | 10/1976 | Picquendar et al. |
| 4,032,955 A | 6/1977 | Anthony et al. |
| 4,090,254 A | 5/1978 | Ho et al. |
| 4,103,415 A | 8/1978 | Hayes |
| 4,146,902 A | 3/1979 | Tanimoto et al. |
| 4,353,086 A | 10/1982 | Jaccodine et al. |
| 4,590,589 A | 5/1986 | Gerzberg |
| 4,612,448 A | 9/1986 | Strack |
| 4,641,166 A | 2/1987 | Takemae et al. |
| 4,672,410 A | 6/1987 | Miura et al. |
| 4,677,455 A | 6/1987 | Okajima |
| 4,868,138 A | 9/1989 | Chan et al. |
| 4,959,703 A | 9/1990 | Ogura et al. |

(List continued on next page.)

FOREIGN PATENT DOCUMENTS

| | | | |
|---|---|---|---|
| FR | 2110326 | 6/1972 | |
| JP | 57 208177 | 12/1982 | |
| KR | 2002017752 A | * 3/2002 | ............ H01L/27/11 |

OTHER PUBLICATIONS

Jun. 1998, F.Nemati and J.D. Plummer, *A Novel High Density, Low Voltage SRAM Cell with a Vertical NDR Device*, Center for Integrated Systems, Stanford University, Stanford, CA 94305.

F.Nemati and J.D. Plummer, *A Novel Vertical Storage SRAM Cell*, Student Paper written for Center for Integrated Systems, Stanford University, Stanford, CA 94305.

F. Nemati and J.D. Plummer, *A Novel Thyristor–based SRAM Cell (T–RAM) for High–Speed, Low–Voltage, Giga–scale Memories*, Center for Integrated Systems, Stanford University, Stanford, CA, 1999.

Baliga, B.Jayant, *Modern Power Devices*, pp. 349–350.

Plummer, James D. and Scharf, Brad W., *Insulated–Gate Planar Thyristors: I–Structure and Basic Operation*, pp. 380–386.

Primary Examiner—John F. Niebling
Assistant Examiner—Angel Roman

(57) ABSTRACT

A semiconductor device having a thyristor is manufactured in a manner that reduces or eliminates manufacturing difficulties commonly experienced in the formation of such devices. According to an example embodiment of the present invention, a thyristor is formed having some or all of the body of the thyristor extending above a substrate surface of a semiconductor device. The semiconductor device includes at least one transistor having source/drain regions formed in the substrate prior to the formation of the thyristor. One or more layers of material are deposited on the substrate surface and used to form a portion of a body of the thyristor that includes anode and cathode end portions. Each end portion is formed having a base region and an emitter region, and at least one of the end portions includes a portion that is in the substrate and electrically coupled to the transistor. A control port is formed capacitively coupled to at least one of the base regions.

36 Claims, 14 Drawing Sheets

U.S. PATENT DOCUMENTS

| | | | |
|---|---|---|---|
| 4,997,790 A | 3/1991 | Woo et al. | |
| 5,106,776 A | 4/1992 | Shen et al. | |
| 5,252,845 A | 10/1993 | Kim et al. | |
| 5,321,285 A | 6/1994 | Lee et al. | |
| 5,324,966 A | 6/1994 | Muraoka et al. | |
| 5,390,145 A | 2/1995 | Nakasha et al. | |
| 5,396,454 A | 3/1995 | Nowak | |
| 5,412,598 A | 5/1995 | Shulman | |
| 5,464,994 A | 11/1995 | Shinohe et al. | |
| 5,471,419 A | 11/1995 | Sankaranarayanan et al. | |
| 5,525,820 A | 6/1996 | Furuyama | |
| 5,543,652 A | 8/1996 | Ikeda et al. | |
| 5,587,944 A | 12/1996 | Shen et al. | |
| 5,689,458 A | 11/1997 | Kuriyama | |
| 5,874,751 A | 2/1999 | Iwamuro et al. | |
| 5,910,738 A | 6/1999 | Shinohe et al. | |
| 5,914,503 A | 6/1999 | Iwamuro et al. | |
| 5,936,267 A | 8/1999 | Iwamuro | |
| 5,939,736 A | 8/1999 | Takahashi | |
| 5,981,984 A | 11/1999 | Iwaana et al. | |
| 6,218,217 B1 * | 4/2001 | Uenishi et al. | 438/138 |
| 6,229,161 B1 | 5/2001 | Nemati et al. | |
| 6,391,689 B1 * | 5/2002 | Chen | 438/135 |
| 6,448,586 B1 * | 9/2002 | Nemati et al. | 257/133 |
| 6,528,356 B2 * | 3/2003 | Nemati et al. | 438/135 |
| 2001/0024841 A1 * | 9/2001 | Noble et al. | 438/138 |
| 2002/0096690 A1 * | 7/2002 | Nemati et al. | 257/133 |
| 2002/0100918 A1 * | 8/2002 | Hsu et al. | 257/200 |

OTHER PUBLICATIONS

S. M. Sze, *Physics of Semiconductor Devices Second Edition*, John Wiley & Sons, pp. 198–209, 1981.

* cited by examiner

THYRISTOR-BASED DEVICE OVER SUBSTRATE SURFACE

RELATED PATENT DOCUMENTS

This application is a continuation of U.S. patent application Ser. No. 09/666,825, filed on Sep. 21, 2000 (STFD.003C1), now U.S. Pat. No. 6,448,586, which is a continuation of Ser. No. 09/092,449, filed on Jun. 5, 1998 (STFD.003PA), now U.S. Pat. No. 6,229,161, to which priority is claimed under 35 U.S.C. §120 for common subject matter.

FIELD OF THE INVENTION

The present invention is directed to semiconductor devices and, more specifically, to semiconductor devices including thyristor-based devices.

BACKGROUND

The semiconductor industry has recently experienced technological advances that have permitted dramatic increases in integrated circuit density and complexity, and equally dramatic decreases in power consumption and package sizes. Present semiconductor technology now permits single-die microprocessors with many millions of transistors, operating at speeds of hundreds of millions of instructions per second to be packaged in relatively small, air-cooled semiconductor device packages. The improvements in such devices has led to a dramatic increase in their use in a variety of applications. As the use of these devices has become more prevalent, the demand for reliable and affordable semiconductor devices has increased. Accordingly, the need to manufacture such devices in an efficient and reliable manner has become increasingly important.

An important part in the circuit design, construction, and manufacture of semiconductor devices concerns semiconductor memories; the circuitry used to store digital information. Conventional random access memory devices include a variety of circuits, such as SRAM and DRAM circuits. The construction and formation of such memory circuitry typically involves forming at least one storage element and circuitry designed to access the stored information.

Various SRAM cell designs based on NDR (Negative Differential Resistance) devices have been proposed in the past. These designs typically consist of at least two active elements, including an NDR device. The NDR device is important to the overall performance of this type of SRAM cell. A variety of NDR devices have been introduced ranging from a simple bipolar transistor to complicated quantum-effect devices. One advantage of the NDR-based cell is the potential of having a cell area smaller than 4T and 6T SRAM cells because of the smaller number of active devices and interconnections. Conventional NDR-based SRAM cells, however, have many problems that have prohibited their use in commercial SRAM products. Some of these problems include: high standby power consumption due to the large current needed in one or both of the stable states of the cell; excessively high or excessively low voltage levels needed for the cell operation; stable states that are too sensitive to manufacturing variations and provide poor noise-margins; limitations in access speed due to i slow switching from one state to the other; limitations in operability due to temperature, noise, voltage and/or light stability; and manufacturability and yield issues due to complicated fabrication processing.

NDR devices including thyristors are also widely used in power switching applications because the current densities carried by such devices can be very high in their on state. Additionally, in a thin capacitively coupled thyristor (TCCT) device, a base region is capacitively coupled to a control port, such as a gate. This capacitive coupling enhances the switching of the thyristor between the blocking state and conducting state. An important aspect of a TCCT device is that the body of the thyristor is thin enough so that the capacitive coupling between the control port and the thyristor base region can substantially modulate the potential of the base region. Because of this, many of the straightforward implementations of a thyristor in a bulk substrate cannot form a device sufficient to meet selected applications, such as those benefiting from a TCCT device.

One method to make a thyristor-based device is to form a vertical silicon pillar by first depositing a layer of silicon and then subsequently masking and etching the deposited silicon layer, leaving the pillar behind. However this method causes a number of manufacturing issues, including issues related to the forming of structures, such as planar MOSFET devices, after the formation of the thyristor. For example, it is extremely difficult to add STI (Shallow Trench Isolation) after the pillar etch since STI usually requires a chemical-mechanical polishing (CMP) step. Also, patterning used to form a mask, such as for photolithography, is difficult near such a pillar due to resist puddling. Additionally, angled implants used after the formation of the pillar may introduce shadowing problems, resulting in the pillar being implanted instead of the intended implantation of other devices near the thyristor. Implanting the pillar to form the thyristor, as well as masking horizontal devices near the pillar, such as source/drain regions of a MOSFET, is also challenging.

The above-mentioned and other difficulties associated with the formation of vertical thyristor-based devices have and continue to present challenges to the manufacture and implementation of such devices.

SUMMARY

The present invention is directed to a thyristor-based memory cell that addresses the above-mentioned challenges. The present invention is exemplified in a number of implementations and applications, some of which are summarized below.

According to an example embodiment of the present invention, a semiconductor device is manufactured having a thyristor structure that addresses the problems mentioned hereinabove. A transistor is formed in a semiconductor substrate having an upper surface. The transistor includes a gate over the upper surface and source/drain regions in the substrate below the upper surface. After forming the transistor, a thyristor is formed using one of the source/drain regions as a portion of the thyristor and extending over the upper surface. In this manner, the thyristor can be formed after the formation of the transistor and/or other circuit elements in the substrate.

In a more particular example embodiment of the present invention, a vertical TCCT device is formed over a semiconductor surface having a source drain region of a transistor formed therein, and a gate for the transistor formed thereon. First, an oxide is formed over the surface and the gate, and an opening is etched in the oxide over the source/drain region. Polysilicon is deposited in the opening and doped to form a first base region of the TCCT adjacent the source/drain region. The first base region is doped to a polarity opposite of the source/drain region, and the combination of the first base region and the source/drain region make up an end portion (e.g., anode or cathode) of the vertical TCCT. A second base region is formed on the first base region, and an emitter is formed on the second base region, the emitter and second base regions making up a second end portion of the TCCT and having an opposite polarity of the first end portion. A portion of the oxide adjacent the TCCT is removed and a thin capacitively coupled gate is formed in place of the oxide, adjacent one of the base regions and capacitively coupled to the base region.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the detailed description of various embodiments of the invention in connection with the accompanying drawings, in which.

Figure 1:
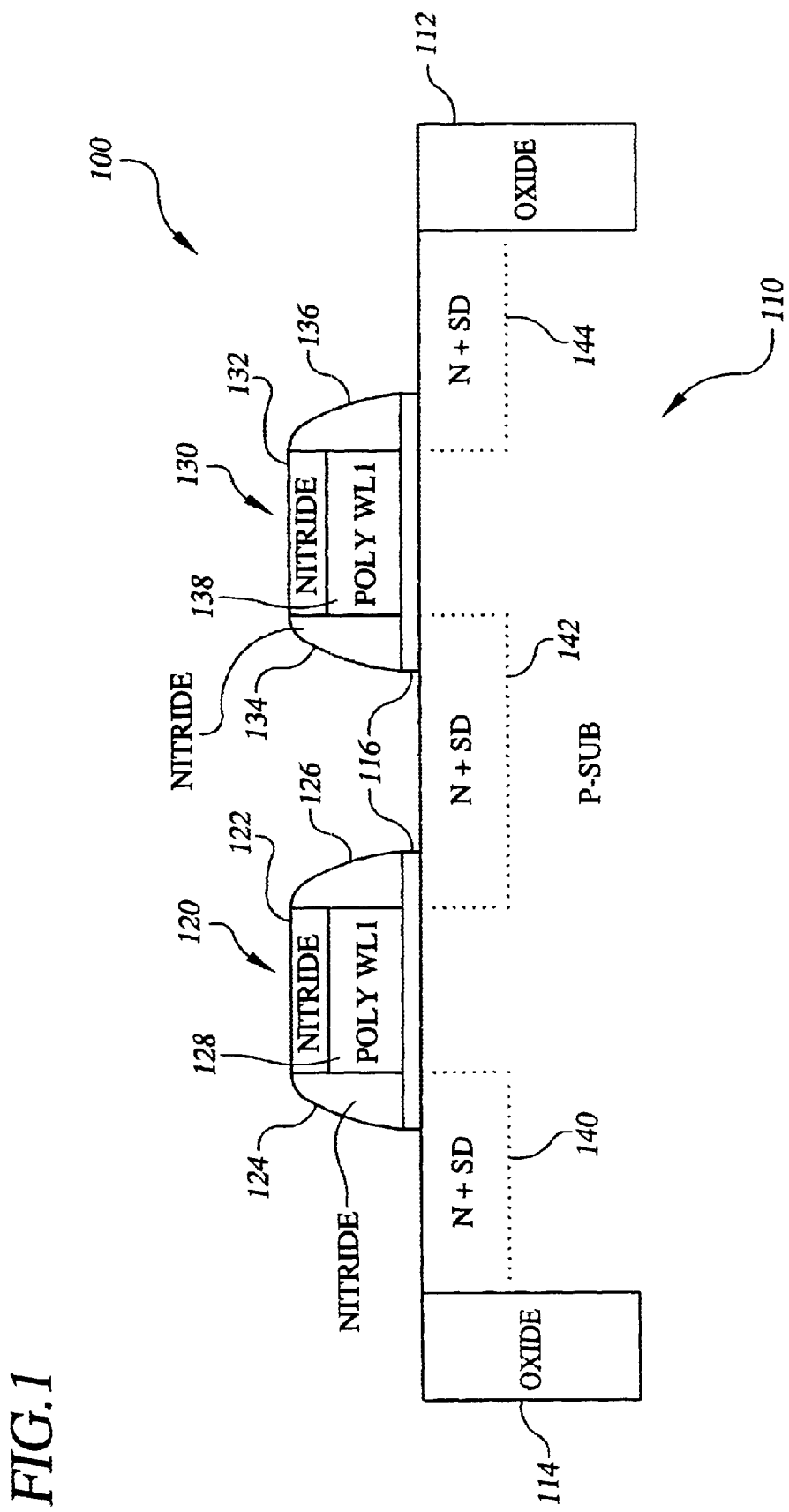
FIG. 1 shows a step in the formation of a thyristor-based semiconductor device, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found to be particularly suited for devices using thyristor-based devices, such as memory cells, and for enhancing the ability to form such devices over a semiconductor substrate. While the present invention is not necessarily limited to such devices, various aspects of the invention may be appreciated through a discussion of various examples using this context.

According to an example embodiment of the present invention, a thyristor-based semiconductor device, such as a memory cell using a TCCT, is manufactured in a manner that includes forming a portion of the device extending from a substrate surface. A dielectric is formed over a substrate having a device therein, such as a logic device, a pass gate, or a transistor having source/drain regions in the substrate and a gate over the substrate. An opening is etched in the dielectric and material that is to be used to form the thyristor is deposited therein. The deposited material is implanted with a selected material to form anode and cathode end portions of the body of the thyristor. A thyristor access port, such as a gate, is then formed capacitively coupled to one of the end portions of the thyristor, and is further coupled to other circuitry in the device. In a more particular implementation, the dielectric material that is to be used to form the thyristor is deposited on a substrate and selectively etched and a semiconductor material is deposited filling the selectively etched oxide, which forms a pillar that is implanted to form the thyristor body. In this manner, challenges including those discussed in the background hereinabove are addressed, including the formation of a thyristor having adequate gate to base coupling while maintaining the ability to manufacture devices near the thyristor.

In one particular implementation, the thyristor is formed as part of a memory cell that uses either an NMOSFET or a PMOSFET as an access transistor to the thyristor. The thyristor is formed using a source/drain region of the access transistor as an emitter region of the body of the thyristor. A base region is formed adjacent the source/drain region and used with the source/drain region to form a first end portion of the thyristor. The base region is then doped to act with the source/drain region as either an anode or cathode end portion of the thyristor. For example, if the source/drain region is N+ doped, the base region is formed having a P dopant. A second end portion of the thyristor is formed having a base and emitter regions doped opposite of the first end portion to form either an anode or cathode end portion. The formation of the end portions is effected so that one end portion is a cathode and the other end portion is an anode. An access port is formed capacitively coupled to one of the base portions and further coupled to circuitry in the device.

In another example embodiment of the present invention, a hard mask, such as nitride, is formed over a logic gate prior to forming the thyristor over the substrate. The hard mask over the gate is advantageous, for example, for optional use as an etch stop that protects the logic gate from subsequent etch processes. The hard mask can also be used to protect the gate from shorting to the thyristor structure, which makes possible tighter spacing between the gate and the subsequently-formed vertical thyristor device. In a more particular example embodiment of the present invention, a polycide is formed over the gate prior to forming the hard mask and improves performance of the device.

The present invention is applicable to a variety of devices. One such device includes a type of NDR-based SRAM ("TCCT RAM") that can potentially provide the speed of conventional SRAM at the density of DRAM in a CMOS compatible process. This SRAM cell uses a thin capacitively-coupled NDR device and more specifically a thin capacitively-coupled thyristor ("TCCT") to form a bistable element for the SRAM cell. For more details of specific examples of this device, reference may be made to: "A Novel High Density, Low Voltage SRAM Cell With A Vertical NDR Device," VLSI Technology Technical Digest, June, 1998; "A Novel Thyristor-based SRAM Cell (T-RAM) for High-Speed, Low-Voltage, Giga-Scale Memories," International Electron Device Meeting Technical Digest 1999, "A Semiconductor Capacitively-Coupled NDR Device And Its Applications For High-Speed High-Density Memories And Power Switches," PCT Int'l Publication No. WO 99/63598, corresponding to U.S. patent application Ser. No. 09/092,449, now U.S. Pat. No. 6,229,161 B1 (STFD.003PA). Each of these documents is incorporated by reference in its entirety.

In the Figures that follow, portions of the devices shown that are similar to those discussed in connection with earlier Figures are labeled using reference numbers that are not inconsistent with those used in other ones of the Figures. In addition, selected Figures show repeated structures for clarity, wherein selected ones of the structures are described with reference numbers with the intent that the reference numbers used may also be applicable to the repeated structures. Moreover, each of the shown example embodiments may be applicable to, for example, a single implementation of the device and/or an array of such structures to be used in selected applications that include memory cells.

FIGS. 1–4 show a semiconductor device 100 being manufactured, according to an example embodiment of the present invention. In FIG. 1, insulator 112 and 114, such as an oxide, is formed in a substrate 110 and acts to electrically isolate devices formed therein. The substrate 110 is selectively implanted to form the various wells and doping levels required by any MOSFET's in the process. A gate dielectric 116 is formed over the substrate, and poly gate materials 128 and 138 are deposited. The poly gate materials are masked, etched and N+source/drain (S/D) regions 140, 142 and 144 are implanted into the substrate 110 (various other implants such as LDD or S/D extensions and/or halo may be done as well). In one implementation, the gate materials include the nitride hard masks 122 and 132, and in another implementation the nitride hard masks are added after implantation. After the S/D regions are created, nitride spacers 124, 126, 134 and 136 are formed on the sidewalls of each gate. In this particular example embodiment, the resulting structure shown in FIG. 1 includes N-MOSFET devices. However, as discussed herein, the present invention is applicable to a variety of semiconductor devices, for example, such as P-MOSFET devices manufactured in a similar manner.

Figure 2:
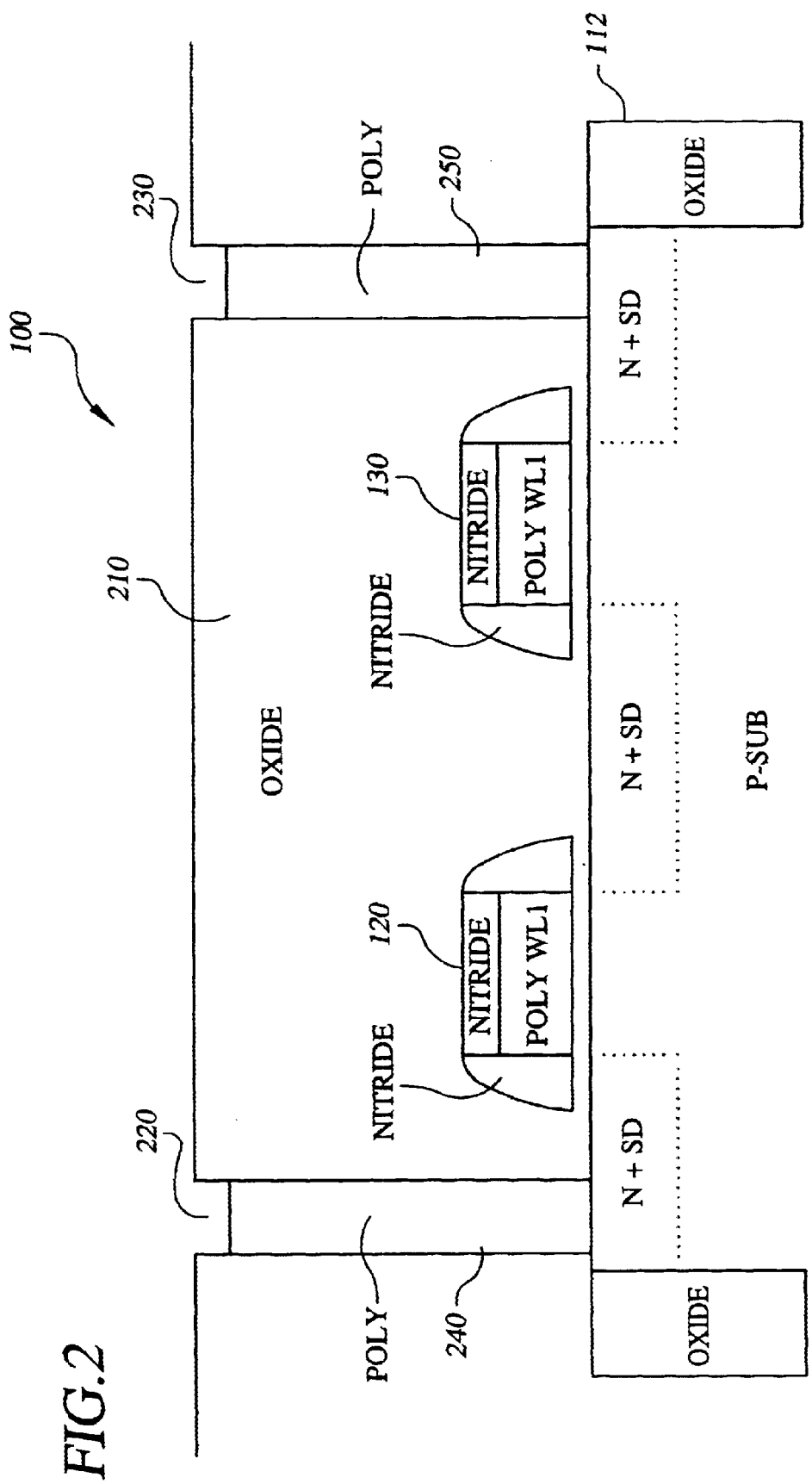
FIG. 2 shows another step in the formation of a thyristor-based semiconductor device, according to another example embodiment of the present invention.
Figure 3:
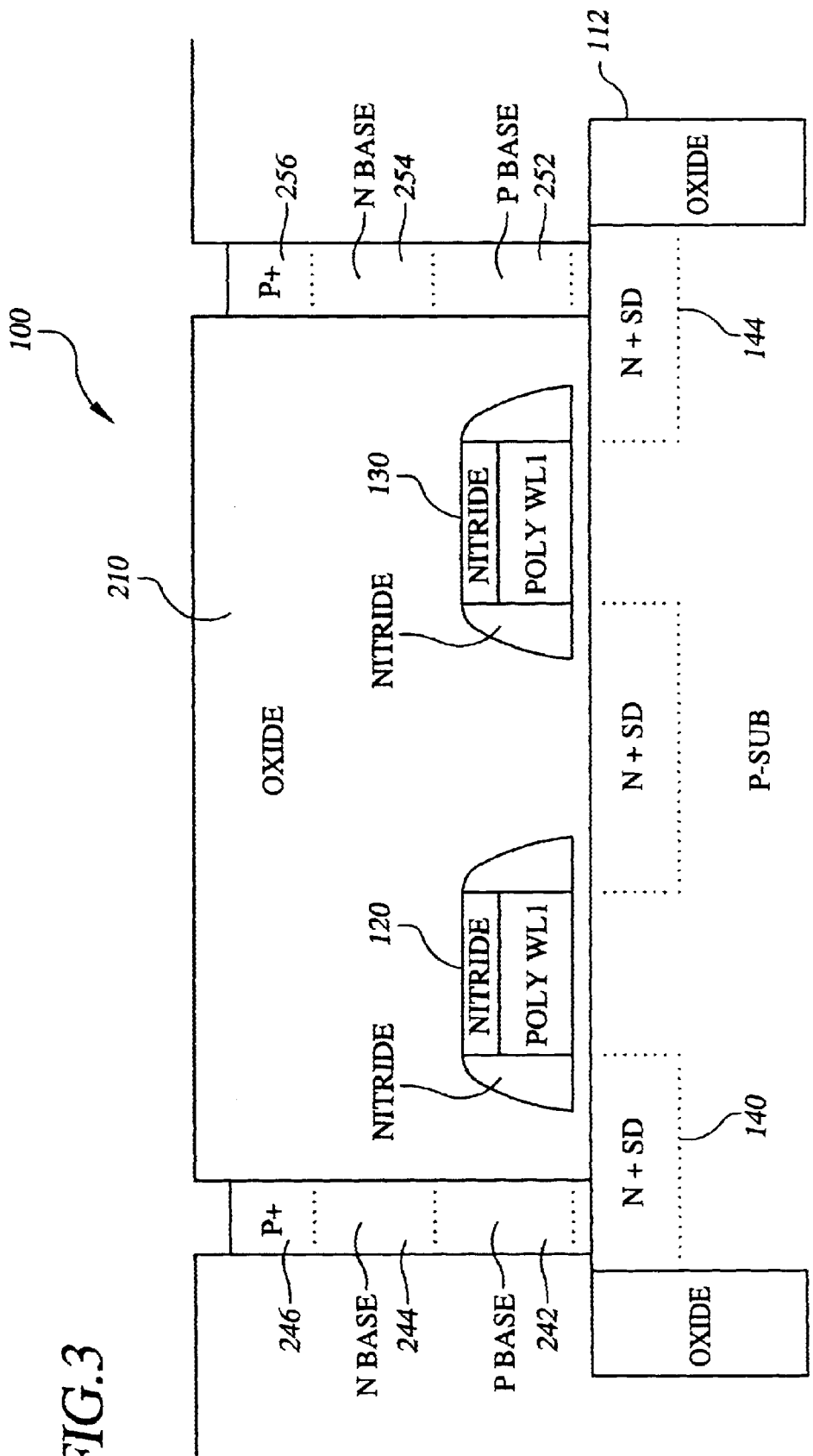
FIG. 3 shows another step in the formation of a thyristor-based semiconductor device, according to another example embodiment of the present invention.

After the gate regions 120 and 130 are formed, an oxide 210 is formed over the device as shown in FIG. 2. A portion of the oxide is removed to form openings 220 and 230, and amorphous polysilicon material 240 and 250 is deposited in the openings and etched back forming pillars therein. The amorphous polysilicon may, for example, be formed using a single deposition or using multiple film depositions. The amorphous polysilicon is recrystallized into single crystal silicon. The pillar material is then doped, as shown in FIG. 3, to form P base regions 242 and 252, N base regions 244 and 254 and P+regions 246 and 256. The P base, N base and P+regions act with the N+S/D regions 140 and 144 in the substrate to form the body of thyristor devices.

Figure 4:
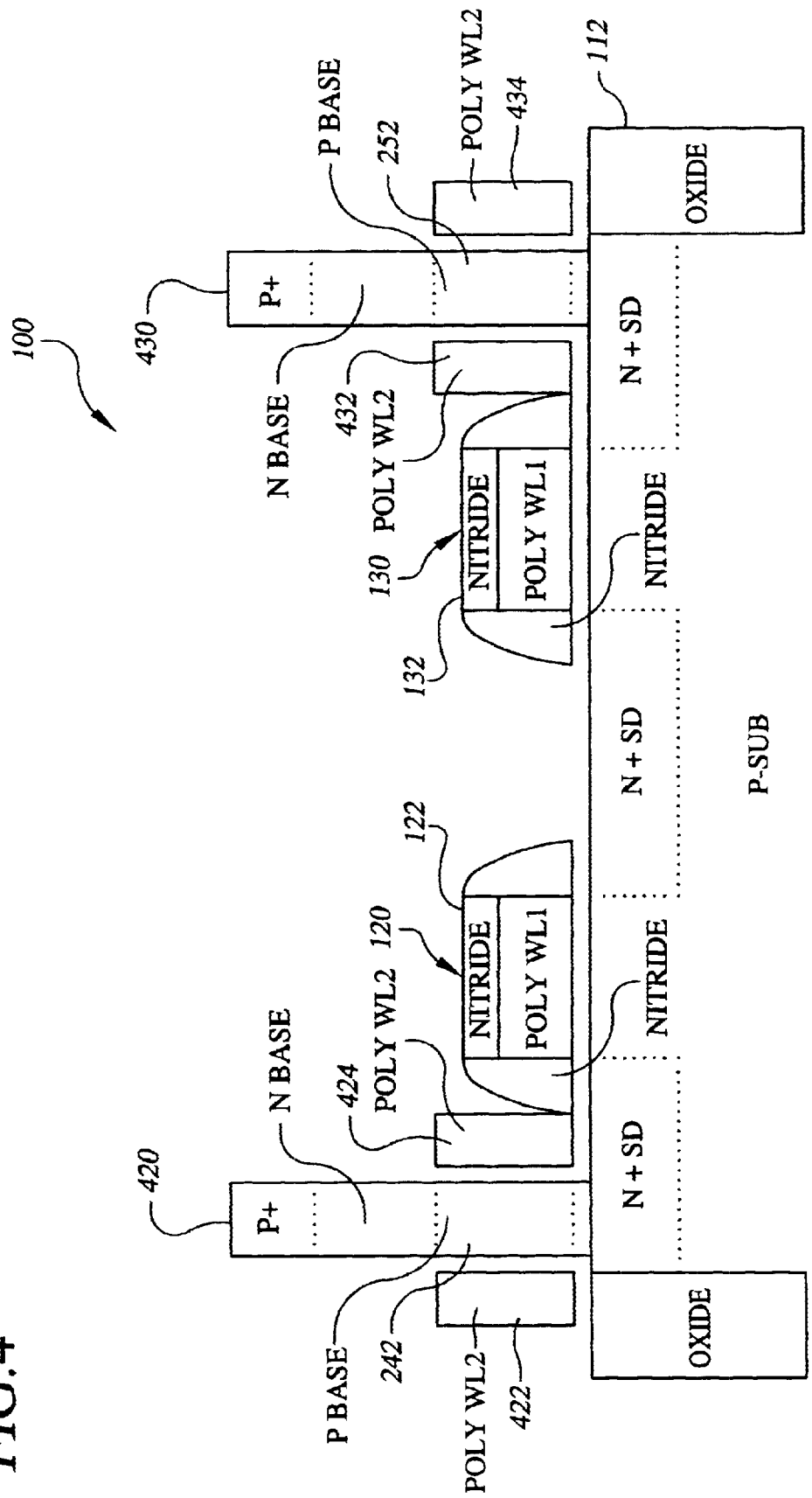
FIG. 4 shows another step in the formation of a thyristor-based semiconductor device, according to another example embodiment of the present invention.

After the body of the thyristor devices is formed in FIG. 3, the oxide 210 is etched to expose the gates 120 and 130 and the thyristor bodies 420 and 430, as shown in FIG. 4. The etching uses the hard masks 122 and 132 as an etch stop over the gates. After the oxide is etched, thyristor control ports 422 and 424 are formed adjacent the P base region 242 of the thyristor 420 and thyristor control ports 432 and 434 are formed adjacent the P base region 252 of the thyristor 430. The formation of the control ports (for example, as gate regions) may include a first deposition and/or growth of a dielectric on the P base followed by a deposition of the control port material. In one implementation, the dielectric is deposited and a mask is patterned over the deposited dielectric and the thyristor body. The dielectric is then etched to form a dielectric having a selected thickness. After the dielectric is etched, control port material, such as polysilicon, is deposited and subsequently masked and etched in a similar manner to the dielectric. In one particular implementation, the gate of the transistor is used as a back gate for the vertical thyristor. Once the vertical thyristor devices and control ports are manufactured, the device can be coupled to other circuitry in a multitude of manners to effect various types of operation.

In another example embodiment of the present invention (not shown), the control ports are formed without using a patterning mask as discussed hereinabove. In this implementation, the thyristor control ports are formed by deposition and etch back leaving a spacer of conductive material to form the control port, which is particularly advantageous in that it simplifies the formation process. The pillars in a given word line are formed sufficiently close to one another such that the control port spacers short to each other. In one particular implementation, a dummy (extra) pillar is added to contact the control port spacer. A contact (e.g., to a metal 1 structure or a local interconnect) is brought down around this dummy pillar to contact the control port spacer material.

Figure 5:
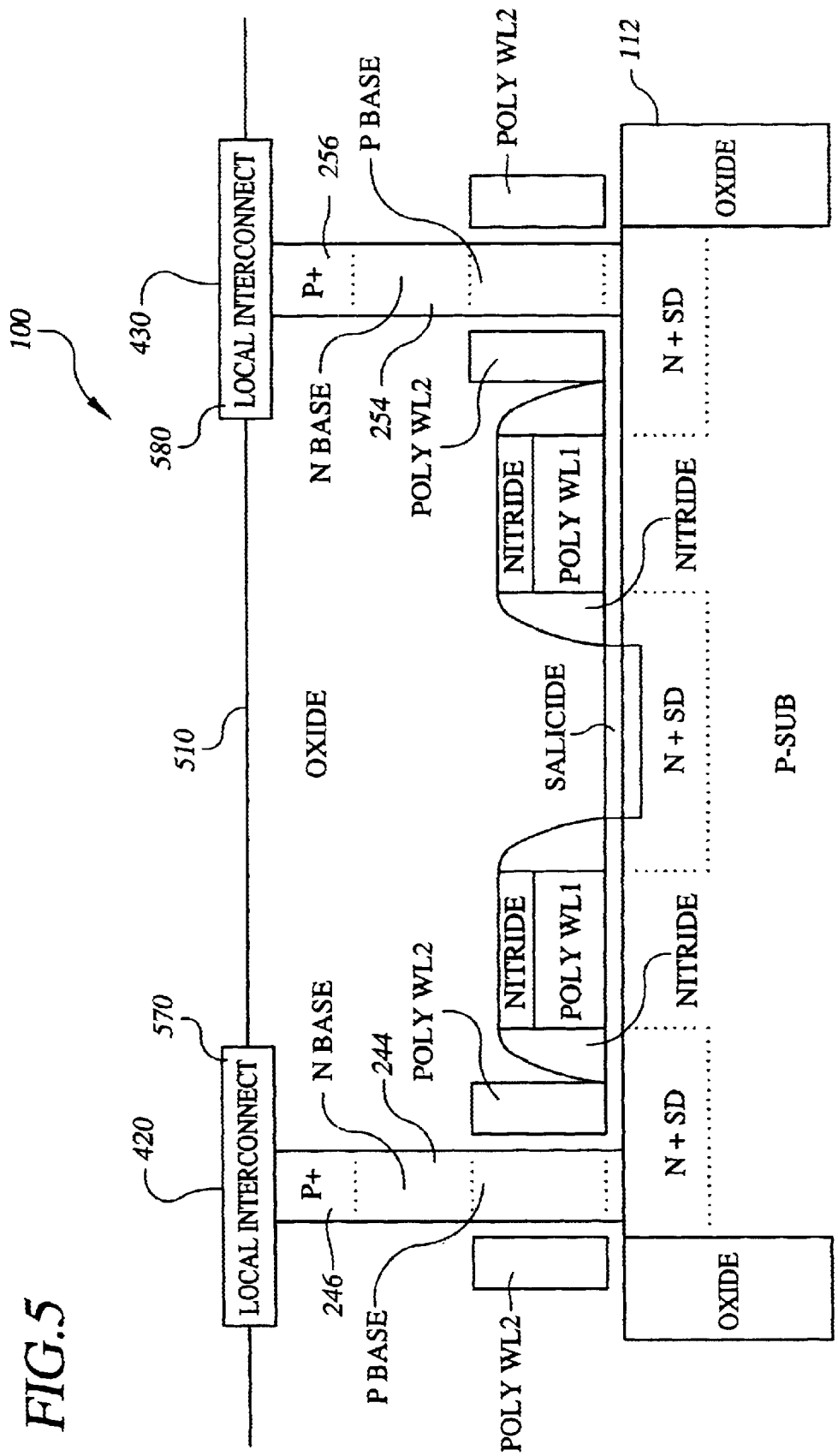
FIG. 5 shows a thyristor-based semiconductor device, such as the device shown in FIG. 4, having thyristors coupled to a local interconnect, according to another example embodiment of the present invention.

In FIG. 5, the semiconductor device shown being manufactured in FIGS. 1–4 is further coupled to a local interconnect, according to another example embodiment of the present invention. An oxide 510 is deposited over the device 100, and local interconnects 570 and 580 are formed coupled to the P+emitter regions 246 and 256, respectively. The formation of the local interconnects may, for example, include depositing conductive material, or implanting the oxide with a conductive material.

In one particular example embodiment of the present invention, polysilicon is used for the local interconnect and is formed as the emitter region of the body of the thyristor. For example, referring to FIG. 5, the oxide can be etched back to expose the top portion of the N base regions 244 and 254. In this implementation, the P+regions would not he formed as indicated in connection with the discussion of FIG. 3. Once the top portion of the N base regions is exposed, polysilicon is deposited on the N base regions and doped to form P+emitter regions of the thyristor and is used as a portion of the local interconnect. This has been found to be particularly advantageous because the chance of over etching and shorting the anode to the N Base region is greatly reduced. Furthermore, using polysilicon for both the P+emitter region and the local interconnect reduces the vertical pillar height of the thyristor devices; which in turn reduces the aspect ratio of the contacts to the control ports of the thyristors, and eliminates the need to separately form the emitter regions.

Figure 6:
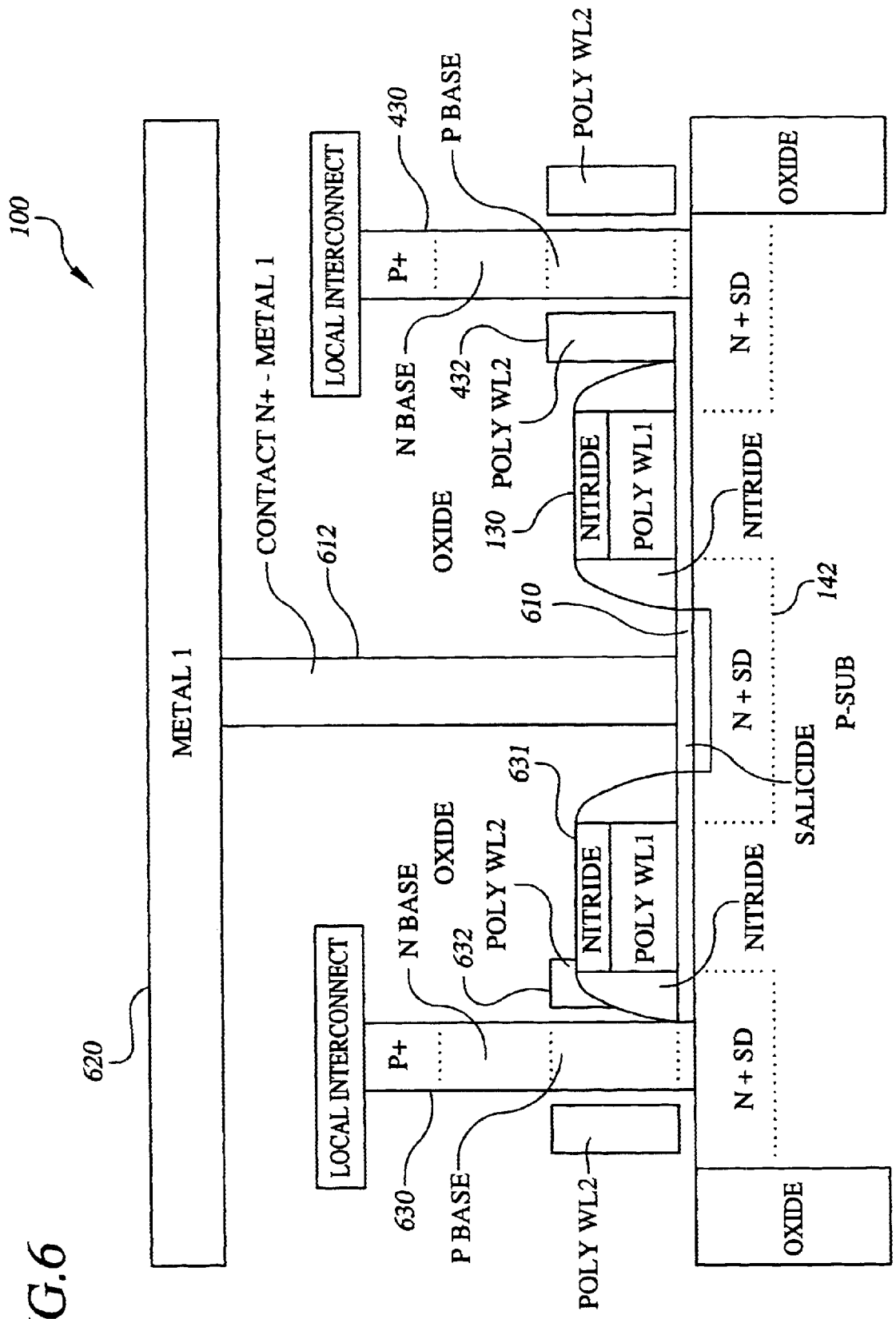
FIG. 6 shows a thyristor-based semiconductor device, such as the device shown in FIG. 5, having a contact from a source/drain region to a metal layer, according to another example embodiment of the present invention.

In another example embodiment of the present invention, a contact from a metal layer in the device (e.g., such as a metal layer commonly referred to as metal 1) to the S/D region 142 is made as shown in FIG. 6. After the local interconnects are formed, an opening in the oxide is etched to expose a region over the S/D region 142. A contact to substrate (which may have a salicide) 610 is then formed over the S/D region 142, and a conductor 612 is deposited in the opening and extending from the device through the oxide. The conductor may, for example, include typical interconnect materials used, such as metal or other conductive materials. A metal interconnect layer 620 is then formed coupled to the contact 612 and is used for making electrical contact between the S/D region 142 and other circuitry in the device and/or to external contacts.

This particular process flow has a hard mask (e.g., nitride) both on top and on the sides of the MOSFET gate. With the hard mask around the MOSFET gate, the structure can tolerate some misalignment in the photolithographic process, which allows for a smaller cell. For example, if the thyristor pillars are misaligned as thyristor body 630 in FIG. 6 is, a portion of the thyristor control port 632 overlaps the MOSFET gate 631. In this instance, the hard mask prevents the thyristor control port 632 from shorting to the MOSFET gate 631.

Figure 7:
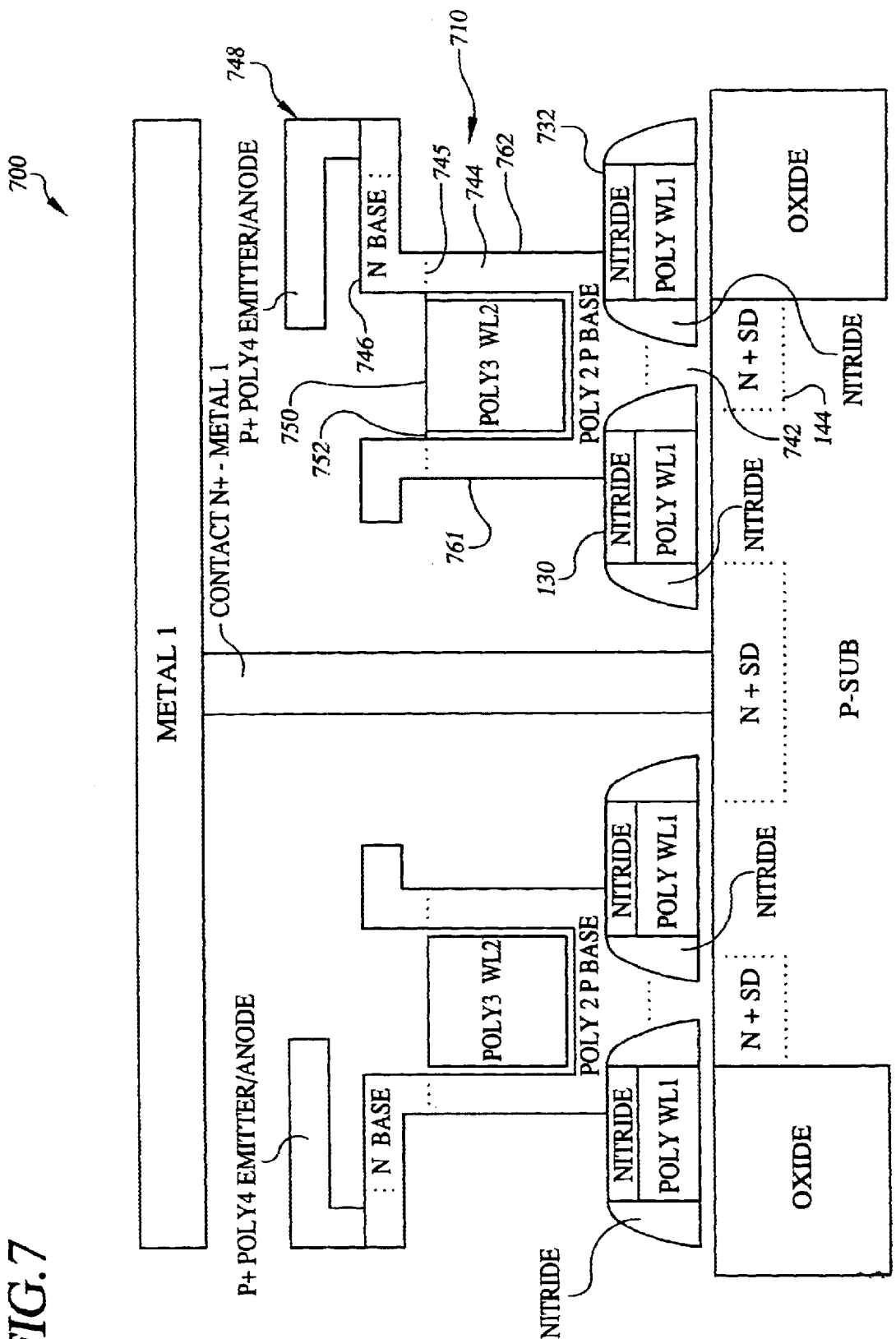
FIG. 7 shows a thyristor-based semiconductor device having horizontal and vertical thyristor portions, according to another example embodiment of the present invention.

As discussed above, the arrangement of the thyristor device over the substrate can be made in a variety of manners, depending upon the application. FIG. 7 shows another example embodiment of the present invention, wherein semiconductor device 700 is shown manufactured having a thyristor device 710 formed over a substrate having S/D region 144 formed therein, and gates 130 and 732 formed thereon. The substrate, S/D regions and the gates are formed, for example, as discussed in connection with FIG. 1. The thyristor in FIG. 7 is formed using the S/D region 144 as a portion of an emitter region. An additional portion 742 of N+material is deposited between gates 130 and 732, and a P base material 744 is formed extending over and up from the N+emitter and the gates 130 and 732, as shown. N base material 746 and a P+emitter material 748 are subsequently formed as shown. The formation of the thyristor body portions 742, 744, 746 and 748 is accomplished using deposition and etch back steps, such as discussed in connection with the example embodiments discussed hereinabove.

The formation of a control port for the thyristor body can be effected either after the formation of the entire thyristor body, or, for example, after the formation of the P base 744. A dielectric 752 is formed around the P base 744. A polysilicon control port 750 is deposited in an opening defined by the dielectric 752. In addition, the formation of the P+emitter region 748 can be effected in a variety of manners, including using a typical deposition process that forms P+polysilicon or implanting P+material into a portion of the thyristor.

The formation of the P base 744 and control port 750 can be effected in a variety of manners. In one implementation (not shown), prior to the formation of the P base region 744, an oxide is deposited over the gates and substrate and etched to form an opening. A thin layer of the thyristor body material is conformably deposited and selectively etched with a photolithographic and etch step (region 744). Region 744 may be formed, for example, by depositing amorphous polysilicon and recrystallizing it. The thyristor body material is implanted to form the P base. A dielectric 752 is formed on the thyristor body (region 744), and control port material 750 is deposited and selectively etched back. The N base region 746 is formed by ion implantation (in this implementation the N base doping is significantly higher than the P base). The P+anode is formed either by selective ion implantation of region 744 or deposition of a dielectric, selective etching of the dielectric and deposition of a P+poly (region 748).

Figure 8A:
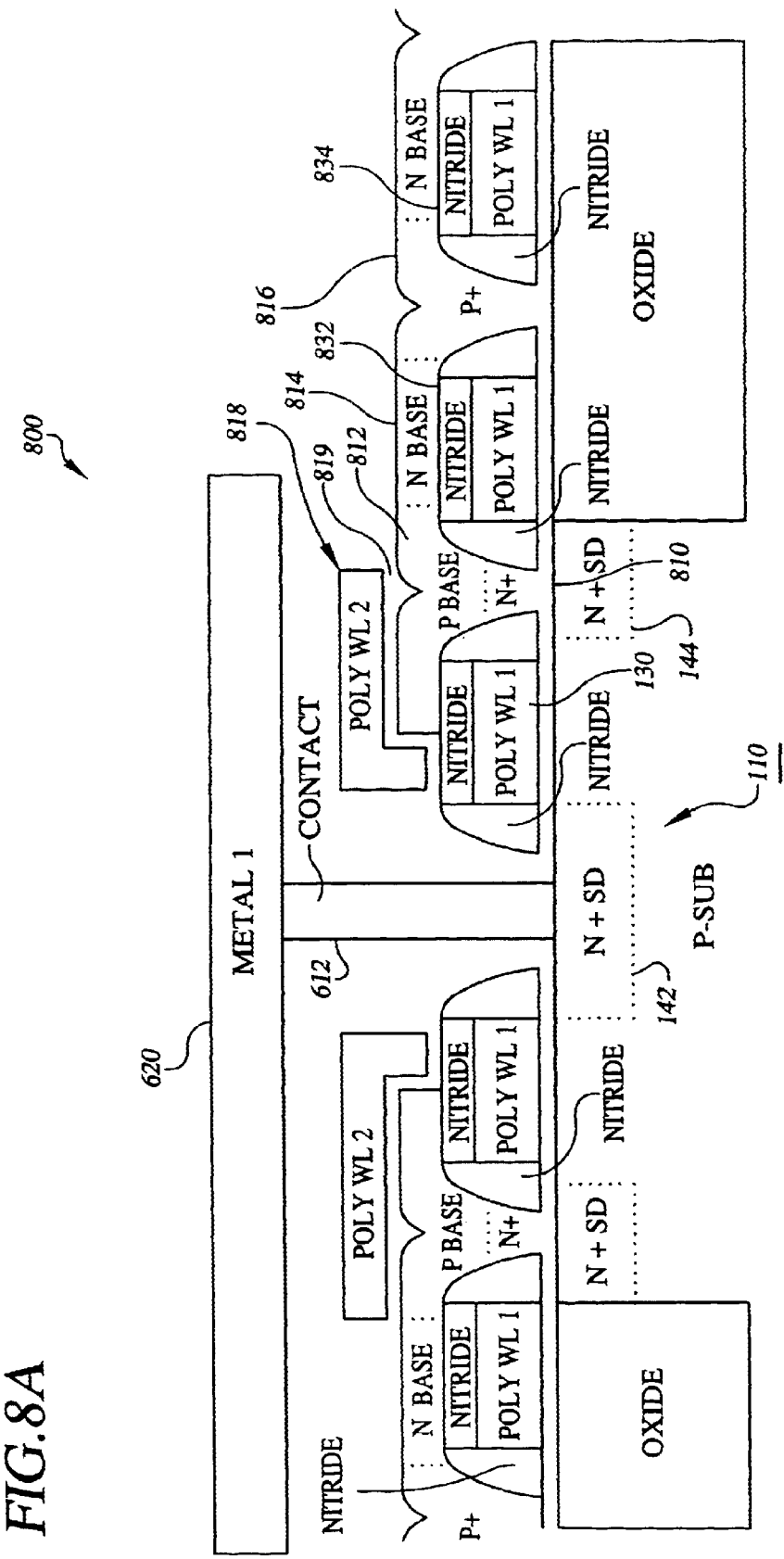
FIG. 8A shows a thyristor-based semiconductor device having a horizontally-oriented thyristor portion over a transistor gate, according to another example embodiment of the present invention.

FIG. 8A shows another example embodiment of the present invention, wherein a transistor is formed in a semiconductor device 800 that includes S/D regions 142 and 144 formed in a substrate, a gate 130 formed over the substrate, and a thyristor having a horizontally oriented portion over the gate 130. The device is formed having a thyristor that uses a self-aligned N base process. A portion of a S/D region in the substrate is used as an emitter 810 of the thyristor. Semiconductor materal is thndeposited over the gate portions to be implanted mid used to make the thyristor. Each of the following implantation steps may be effected in a variety of manners, such as via conventional masking and implanting processes. P base material 812 is implanted, and a poly gate 818 is then formed over tic thyristor body material, with an intervening gate dielectric 819. Using the poly gate 818 as a mask, N base material 814 is implanted over the hard mask or gate 832. In one implementation, the N base has significantly higher implant dose than the P base so the P base can be counter doped to form N base material. P+emitter mated al 816 is selectively implanted between and over a portion of a hard mask of gates 832 and 834, completing the formation of the thyristor. The N+emitter 810, P base 812, N base 814 and P+emitter 816 make up the body of a thyristor, and the poly gate 818 is used as a control port via the P bass material 812. This particular method for deposition and formation of a thyristor device is particularly advantageous because the N base 814 is self-aligned to the gate 818, and further, because the P base capacitance area is increased due to the extension of the gate 818. For more information regarding increasing the capacitive coupling via the base portion of the thyristor, reference may he made to U.S. patent application Ser. No. 10/023,060, filed concurrently herewith on Dec. 17, 2001, now U.S. Pat. No. 6,583,452.

Figure 8B:
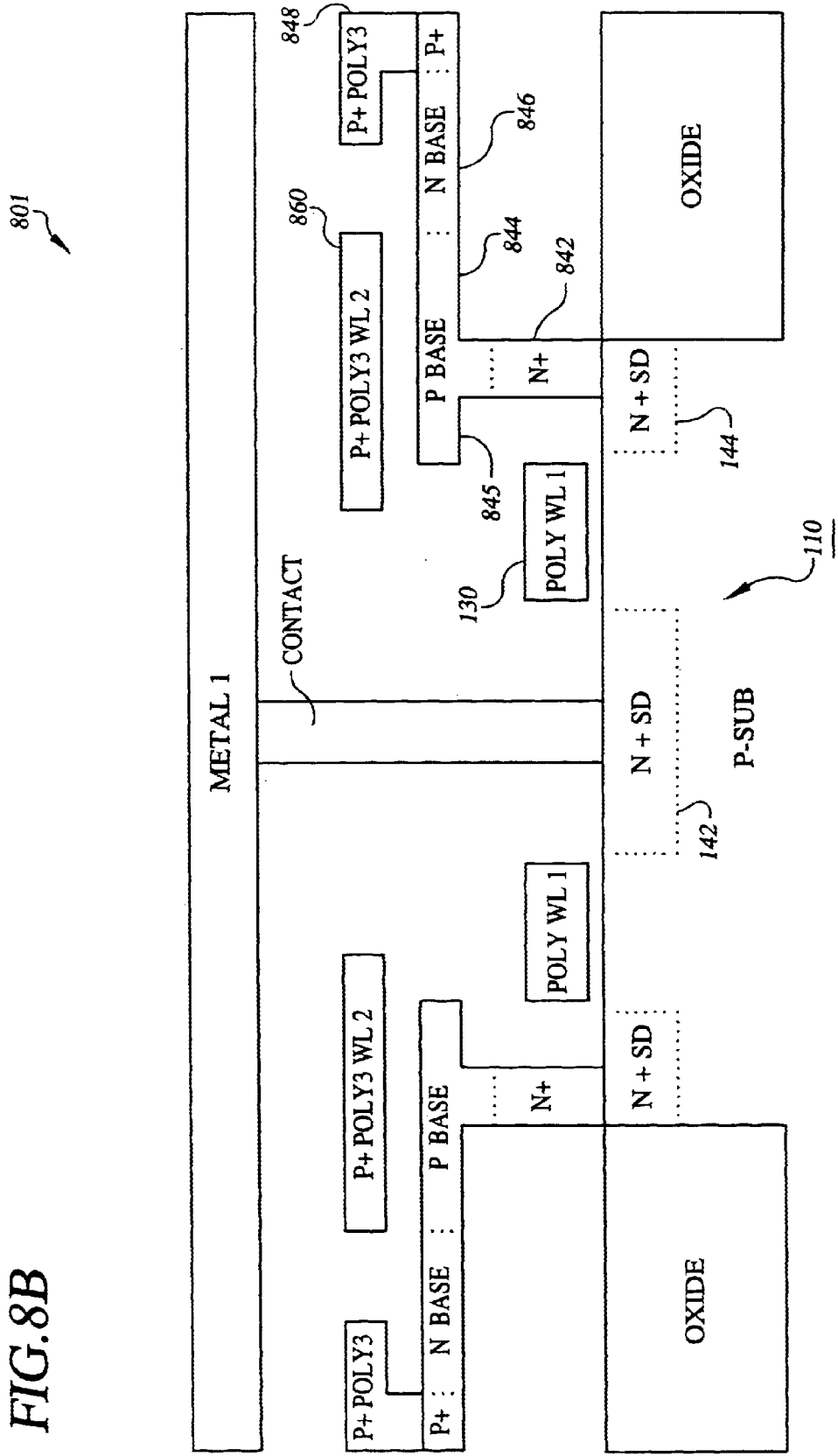
FIG. 8B shows another thyristor-based semiconductor device having a horizontally-oriented thyristor portion over a transistor gate, according to another example embodiment of the present invention.

FIG. 8B is another thyristor-based semiconductor device 801 having a horizontally oriented portion of the thyristor over a gate, according to another example embodiment of the present invention. Similar to FIG. 8A, the device 801 has a transistor device having source/drain regions 142 and 144 in a substrate and a gate 130 over the substrate and above the source/drain regions. The thyristor includes a vertical N+emitter region 842, horizontally oriented P base region 844, N base region 846 and P+emitter region 848. A thyristor gate 860 is formed over and capacitively coupled to the P base region 860. In one implementation, the gate is deposited over the P base region prior to the formation of the N base region and is used to self-aligned the N base region to the gate. The portion 845 of the P base that extends over the gate 130 increases the capacitive coupling of the P base to the gate.

Figure 9:
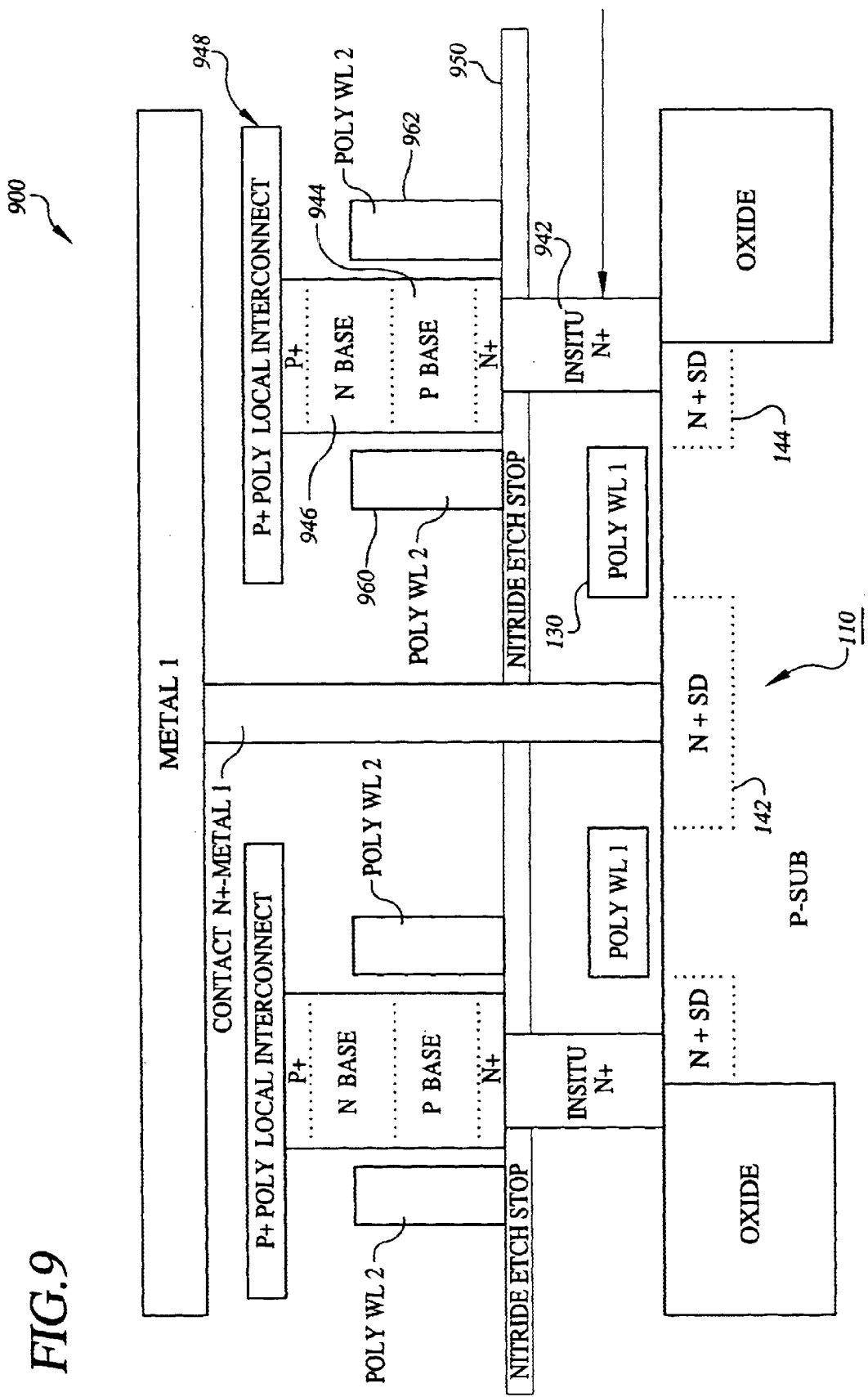
FIG. 9 shows a thyristor-based semiconductor device having an etch stop embedded in dielectric over a transistor gate, according to another example embodiment of the present invention.

FIG. 9 shows another thyristor-based semiconductor device 900 formed using five polysilicon depositions and an etch stop embedded in the dielectric above the MOSFET gate poly (region 130), according to another example embodiment of the present invention. The device includes a transistor having source/drain regions 142 and 144 and gate 130 formed using a first polysilicon deposition. The S/D region 144 is used as a portion of an N+emitter of a thyristor device. Oxide is deposited over the substrate 110, the S/D and the gate, and a nitride etch stop 950 is formed over the oxide. The nitride and oxide are selectively etched to form an opening and N+polysilicon (region 942) is deposited in the opening and planarized (e.g., using CMP or etch back) to form the N+cathode. Additional oxide is deposited, an opening is formed therein, polysilicon is formed in the opening and doped to form P base 944 and N base 946 during a third polysilicon deposition and the polysilicon is etched back. In one implementation, amorphous polysilicon is used for regions 942, 944 and 946 and is recrystallized. In another implementation, the N base (946) and P base (944) regions are formed with ion implants. The oxide above the nitride etch stop is removed and a gate dielectric is formed on regions 946 and 944 of the thyristor body. A fourth polysilicon deposition is used to deposit material to form poly gate portions 960 and 962 and additional oxide is deposited over the poly gate portions. A fifth polysilicon deposition is doped to be P+either in situ or with a P+implant to form P+emitter/local interconnect 948. This particular example embodiment is advantageous because it makes possible greater separation between the gate 960 and gate 130, reducing the capacitive coupling between them.

Figure 10:
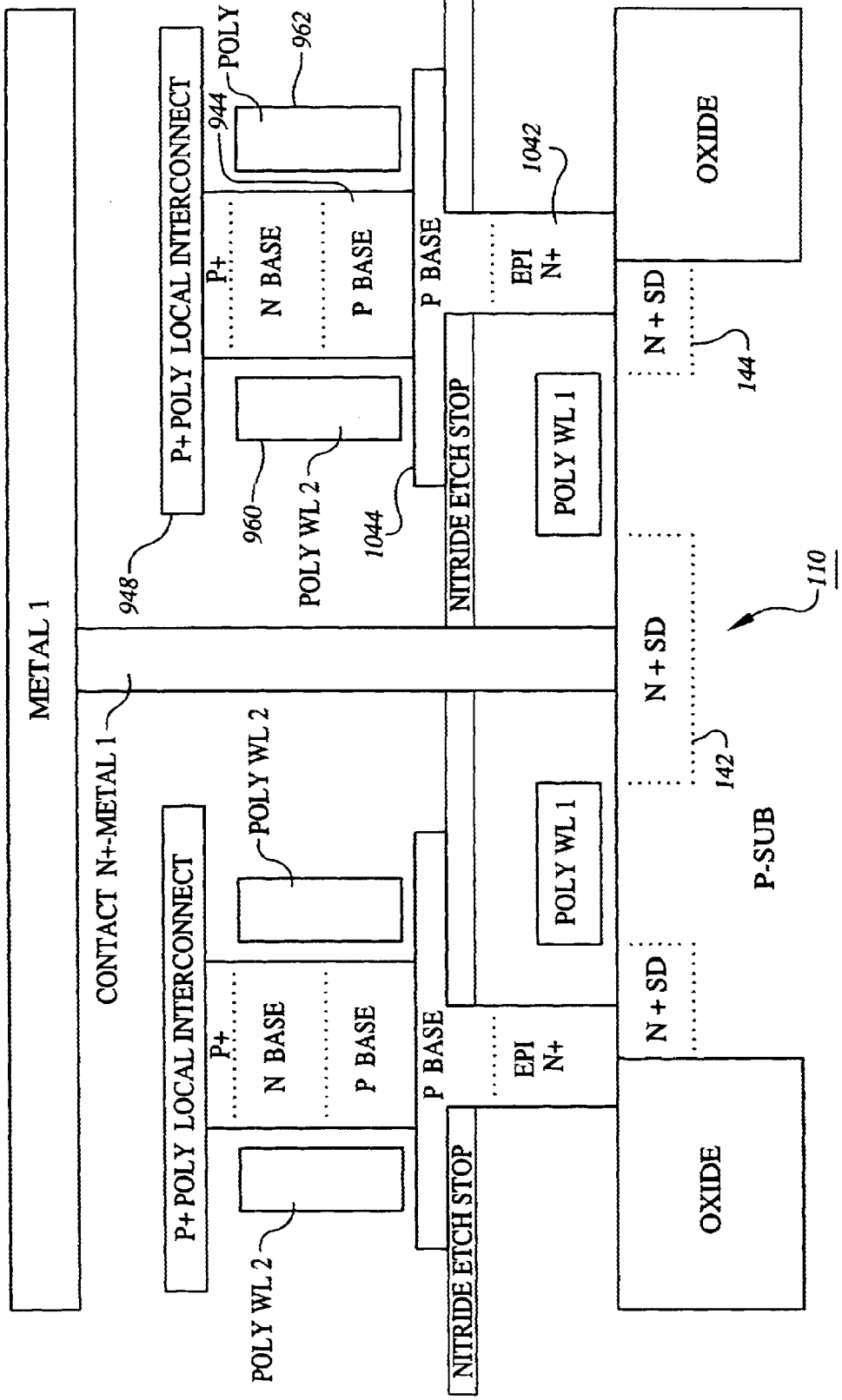
FIG. 10 shows another thyristor-based semiconductor device having an etch stop embedded in dielectric over a transistor gate, according to another example embodiment of the present invention.

FIG. 10 is another thyristor-based semiconductor device 1000 having an etch stop 950 embedded in the dielectric above a gate polysilicon (region 130), according to another example embodiment of the present invention. In this implementation, a portion 1042 of the N+emitter region above the substrate 110 is formed using an episilicon growth and subsequent N+doping. The P base region is formed over the N+emitter and having a first portion 1044 extending laterally over the etch stop 950 using, for example, selective episilicon growth. The extended portion reduces the accuracy needed to subsequently form portions of the thyristor extending over the P base region (e.g., P base 944), and reduces the chance of misalignment of the vertical thyristor portions.

Figure 11A:
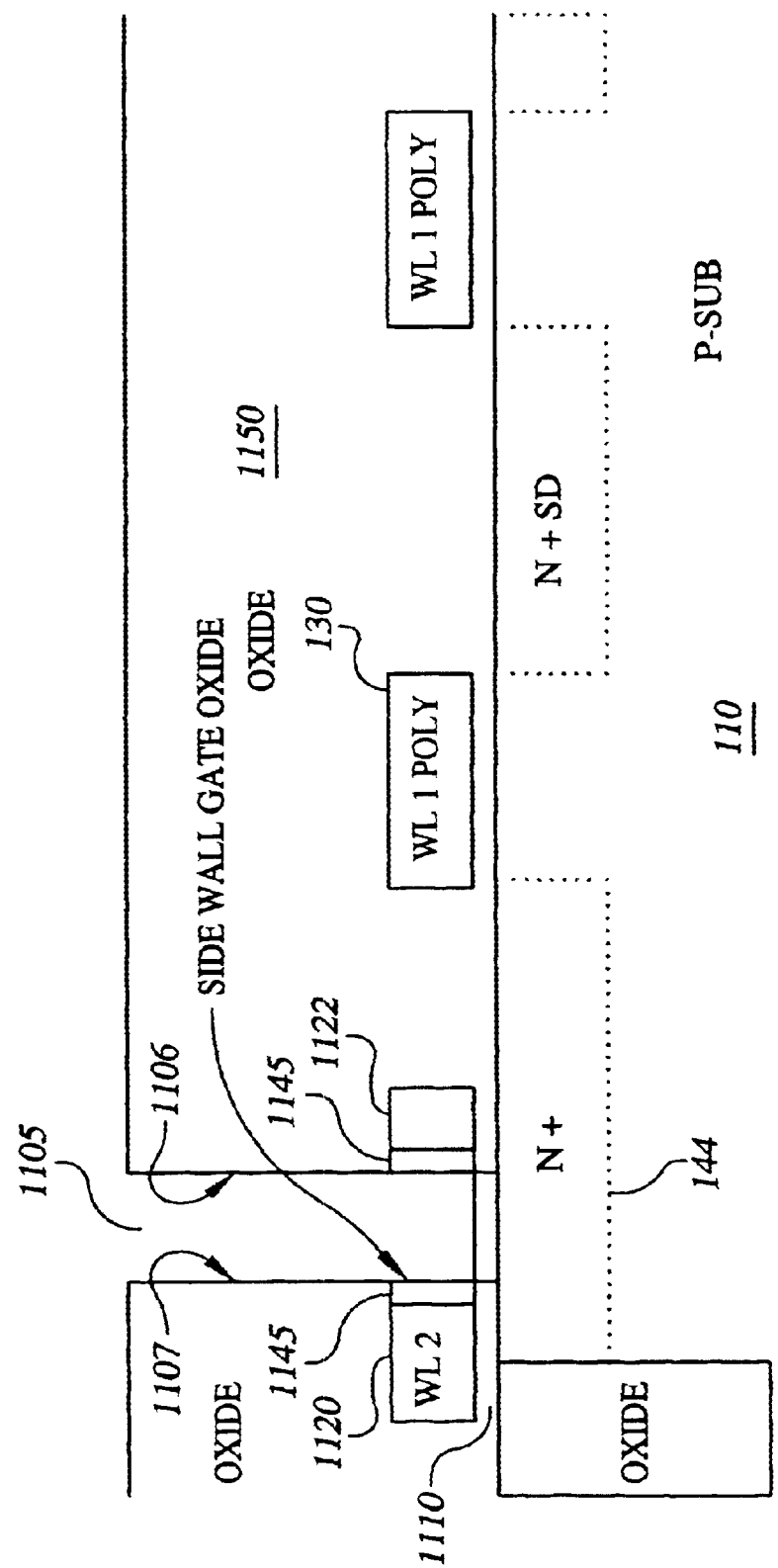
FIG. 11A shows a thyristor-based semiconductor device undergoing manufacture, according to another example embodiment of the present invention.
Figure 11B:
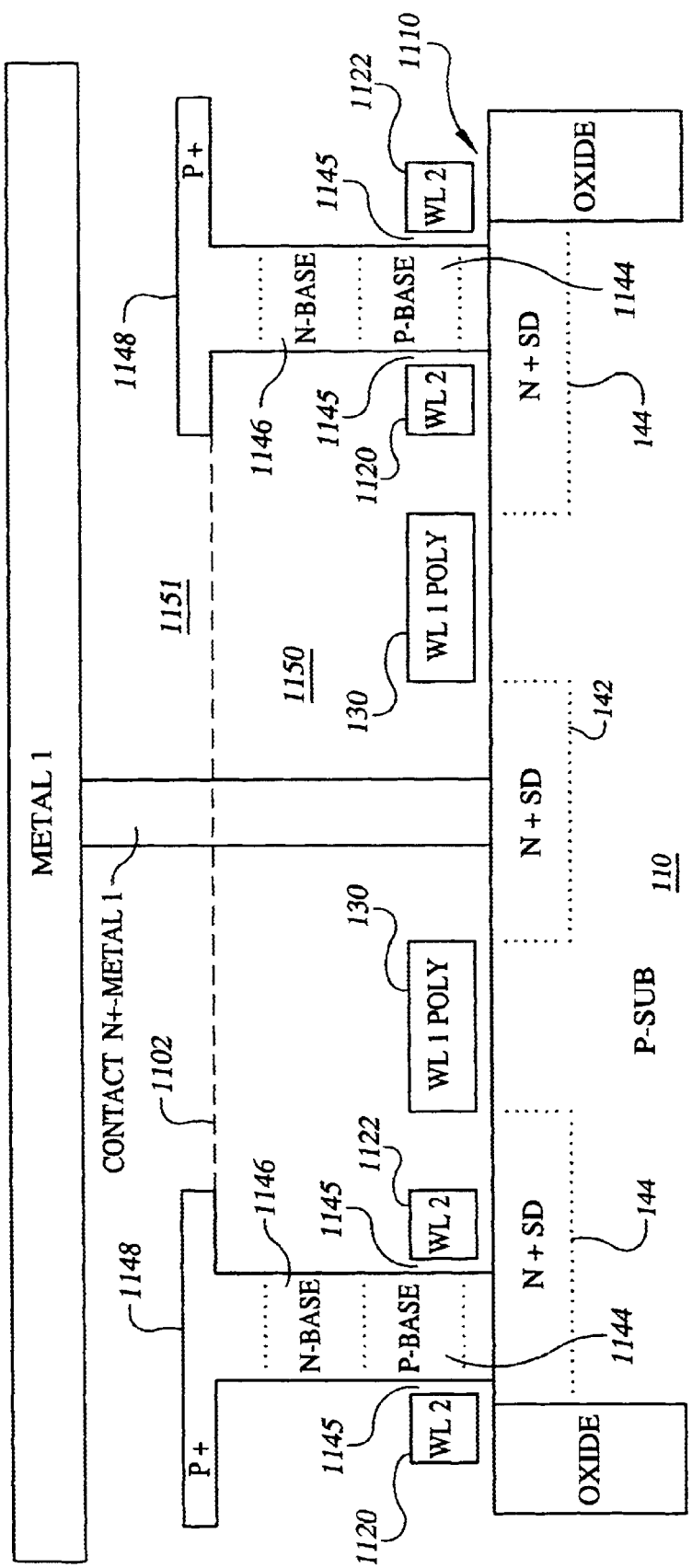
FIG. 11B shows a thyristor-based semiconductor device undergoing manufacture, according to another example embodiment of the present invention.

FIGS. 11A and 11B show a thyristor-based semiconductor device being manufactured using a single polysilicon deposition process to form both the transistor gate 130 and sidewall thyristor gates 1120 and 1122, according to another example embodiment of the present invention. In FIG. 11A, gates 1120, 1122 and 130 are formed using a single deposition process and an oxide 1150 is formed over the substrate 110 and gates. In one implementation, a thick gate oxide 1110 is deposited on the substrate prior to formation of the gates to make possible high voltage applications. An opening 1105 having sidewalls 1106 and 1107 is etched in the oxide where a vertical portion of the thyristor is to be formed. Side wall gate oxide 1145 is formed at the sidewalls in the opening and adjacent the gates, and any oxide formed at the bottom of the opening is anisotropically etched to expose the N+region 144. In a more particular implementation, the part of the N+region 144 that is under the thyristor is implanted through the opening 1105. In another more particular implementation, the polysilicon gates 1120 and 1122 are etched to recess them from the openings, prior to the formation of the gate oxide.

In FIG. 11B, the opening is filled with amorphous polysilicon that is also formed extending laterally over the oxide (region 1148), and the polysilicon is recrystallized (shown here as part of two repeated and similarly numbered thyristor structures). For clarity, dashed line 1102 represents the upper portion of the oxide as deposited in FIG. 11A. P base 1144, N base 1146 and P+emitter 1148 regions are then implanted into the recrystallized polysilicon. The P+emitter region is selectively etched to form the thyristor structures shown. Additional oxide 1151 is deposited over the oxide 1150 and over the P+emitter regions 1148, and contacts and interconnects can then be formed therein and thereon, as described in example embodiments above. The thyristor pillar structure exhibits strength due to the oxide adjacent the pillar not necessarily being etched.

Figure 12:
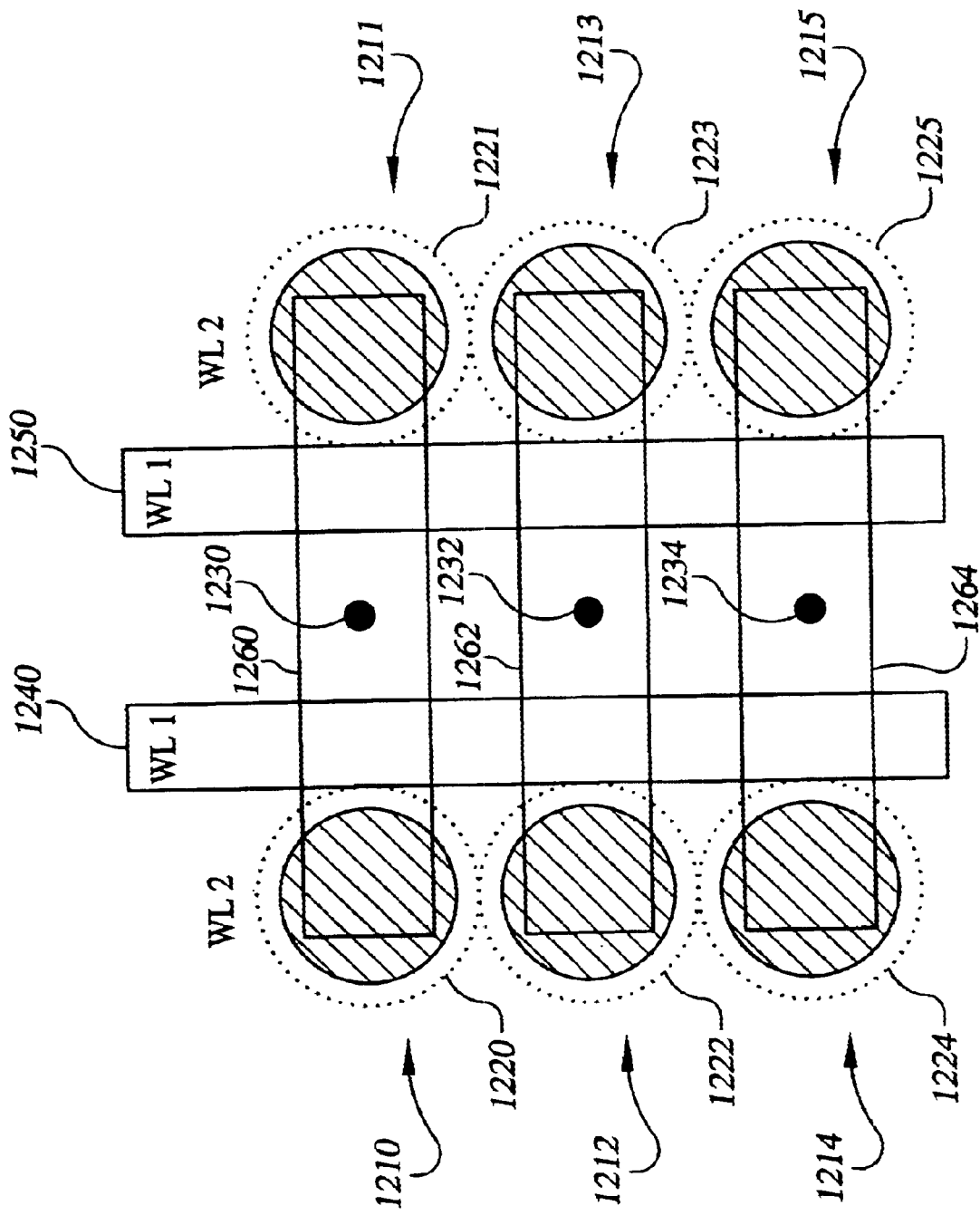
FIG. 12 shows a top-down view of a memory cell employing thyristor-based memory cells, such as those described hereinabove, according to another example embodiment of the present invention.

FIG. 12 is a top-down view of a memory cell employing thyristor-based memory cells, such as those described hereinabove, according to another example embodiment of the present invention. Vertical thyristors 1210–1215 are formed having poly gates 1220–1225 formed around each pillar and acting as word line 2 (WL2) contacts. The memory cell includes transistor gates 1240 and 1250 that act as word line 1 (WL1) contacts. The gates are formed over diffusion regions 1260, 1262 and 1264, in which source/drain regions are formed. As described hereinabove, the source/drain regions may be used as a portion of a thyristor, such as an N+emitter region. Bit line contacts 1230, 1232 and 1234 are formed to the diffusion regions, and relate, for example, to contacts such as the contact 612 shown in FIG. 6. In addition, various other arrangements of the gates, thyristors, diffusion regions and bit line contacts are applicable to the present invention.

The thyristor-based devices described hereinabove can be implemented in a variety of manners and used in a variety of applications. In one implementation, the thyristor based device is coupled to circuitry adapted to form one or more commonly-known circuits, such as an electronic latch, a power thyristor, an output driver, a power management device and an electrostatic discharge device adapted to latch and shunt power from circuitry coupled to the thyristor-based device.

In example embodiments discussed hereinabove, the thyristor body semiconductor material has been deposited into an opening in a dielectric. In a more particular example embodiment of the present invention, the thyristor body semiconductor material is deposited after formation of the transistors and selectively etched, leaving a pillar. The pillar is then implanted to form one or more body portions of the thyristor. In one implementation, an etch stop is formed over the transistors, prior to depositing the thyristor body material. The material is then deposited over the transistors and selectively etched to form the pillar.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such changes may include, but are not necessarily limited to: altering the shapes, locations, and sizes of the illustrated thyristors; adding structures to the integrated circuit device; increasing the number of PN sections in the thyristor-based memory device; and interchanging P and N regions in the device structures and/or using PMOSFETS rather than NMOSFETS. In addition, for more information regarding implementations to which the present invention is applicable, reference may be made to U.S. Pat. No. 6,229, 161, dated May 8, 2001 and entitled "Semiconductor Capacitively-Coupled NDR Device And Its Applications In High-Density High-Speed Memories And In Power Switches," which is fully incorporated herein by reference. Such modifications and changes do not depart from the true spirit and scope of the present invention that is set forth in the following claims.

What is claimed is:

1. A method for forming a thyristor-based device having a thyristor structure with two base portions and a junction therebetween, the method comprising:
 forming a semiconductor substrate having an upper surface;
 forming a transistor having a gate over the upper surface and source/drain regions in the substrate below the upper surface;
 forming a thyristor with one of the source/drain regions as another portion of the thyristor and with a control port capacitively-coupled to one of the base portions and aligned with the junction.

2. The method of claim 1, wherein forming a thyristor includes using the source/drain regions as an emitter of the thyristor.

3. The method of claim 2, wherein forming the transistor includes doping the source/drain region to be used in the thyristor-based cell to be p+doped.

4. The method of claim 1, wherein forming a thyristor includes using one of the source/drain regions as a cathode of the thyristor.

5. The method of claim 4, wherein forming the transistor includes doping the source/drain region to be used in the thyristor to be n+doped.

6. The method of claim 1, wherein forming a thyristor includes forming a memory cell.

7. The method of claim 1, wherein forming a thyristor includes forming a latch.

8. The method of claim 1, further comprising coupling the thyristor to additional circuitry in the semiconductor substrate.

9. The method of claim 8, wherein coupling the thyristor to additional circuitry includes forming a logic device having a power thyristor.

10. The method of claim 9, wherein forming a logic device includes forming an output driver.

11. The method of claim 9, wherein forming a logic device includes forming a power management device.

12. The method of claim 8, wherein forming a vertical thyristor includes forming an electrostatic discharge circuit adapted to latch and shunt power from the coupled circuitry.

13. The method of claim 1, wherein forming a transistor having a gate includes forming a MOSPET device.

14. The method of claim 1, wherein forming the thyristor includes forming the thyristor using a single deposition process and subsequently implanting the deposited material.

15. The method of claim 1, wherein forming a thyristor includes forming the other portion of the thyristor extending over the upper surface.

16. The method of claim 1, wherein forming the thyristor includes selfaliining one of the base portions to the control port.

17. A method for forming a thyristor-based device having a thyristor structure, the method comprising:
 forming a semiconductor substrate having an upper surface;
 forming a transistor having a gate over the upper surface and source/drain regions in the substrate below the upper surface; and
 forming a thyristor by depositing a dielectric over the formed transistor, creating an opening in the dielectric, and forming the thyristor-based device in the etched opening with one of the source/drain regions as a portion of the thyristor and extending over the upper surface.

18. The method of claim 17, further comprising etching the dielectric and exposing the formed transistor and the thyristor.

19. The method of claim 18, further comprising:
 forming a gate dielectric on the thyristor; and
 forming a control port on the gate dielectric.

20. The method of claim 1, wherein forming the thyristor includes depositing multiple films.

21. The method of claim 1, wherein forming the thyristor-based device includes using the gate of the transistor as a back gate for the thyristor.

22. The method of claim 1, wherein forming the thyristor includes forming a sidewall gate for the thyristor.

23. The method of claim 1, wherein forming the thyristor includes forming one of the base portions having two vertical regions and forming a gate located laterally between the two vertical regions.

24. The method of claim 1, wherein forming the thyristor includes forming the control port self-aligned to one of the base portions of the thyristor structure.

25. The method of claim 1, further comprising frowning a dielectric over the transistor gate, wherein forming the thyristor comprises forming the control port for the thyristor separated from the transistor gate by the dielectric, the dielectric being adapted to reduce parasitic capacitance between the thyristor gate and the transistor gate.

26. The method of claim 25, wherein forming a dielectric over the transistor gate includes forming a nitride etch stop and using the etch stop to form an emitter portion of the thyristor coupled to a source/drain region of the transistor.

27. The method of claim 26, wherein forming a thyristor includes forming one of the base portions of the thyristor extending over the emitter portion and laterally over the nitride etch stop.

28. The method of claim 1, wherein forming a thyristor includes forming amorphous polysilicon, recrystallizing the amorphous polysilicon and forming at least a portion of the thyristor using the recrystallized amorphous polysilicon.

29. The method of claim 1, further comprising forming a hard mask over the transistor gate, the hard mask being adapted to electrically insulate the transistor gate from the thyristor.

30. The method of claim 1, further comprising depositing an oxide over the transistor gate and forming an etch stop over the oxide, prior to forming the thyristor, the etch stop being adapted to reduce capacitive coupling between the control port and the transistor gate.

31. The method of claim 1, wherein forming a thyristor includes forming a local interconnect as part of the thyristor structure and to electrically couple the thyristor to another portion of the semiconductor device.

32. The method of claim 1, wherein forming the thyristor comprises:
 forming the control port over the substrate;
 forming an oxide over the substrate, the transistor and the control port;
 removing a portion of the oxide adjacent the thyristor control port and forming an opening having a sidewall;
 etching a portion of the sidewall adjacent the control port and depositing gate oxide in the etched portion; and
 forming at least one base section of the thyristor in the opening that is capacitively coupled to the control port via the oxide.

33. The method of claim 1, further comprising frowning a plurality of the thyristor-based devices, the plurality of thyristor-based devices forming a memory device.

34. The method of claim 1, wherein forming the thyristor includes forming a thyristor having a gate that is adapted to capacitively couple a signal to the thyristor to control current passing through the thyristor independently from any MOS inversion channel formation against a portion of the thyristor to which the gate is capacitively coupled.

35. A method for forming a thin-capacitively-coupled thyristor-based memory device having a thyristor structure, the method comprising:

forming a semiconductor substrate having an upper surface;

forming a transistor having a gate over the upper surface and source/drain regions in the substrate below the upper surface;

after forming the transistor, depositing an oxide layer over the substrate and the transistor;

removing a portion of the oxide over a first one of the source/drain regions and forming an opening, the source/drain region being used as one of the regions of the thyristor;

forming amorphous polysilicon in the opening;

recrystallizing the amorphous polysilicon;

implanting the recrystallized polysilicon and forming a thyristor P base, N base and emitter region in the opening;

exposing a sidewall of the polysilicon;

forming a gate dielectric on the sidewall and adjacent one of the thyristor base portions;

depositing polysilicon on the gate dielectric and forming a thin capacitivcly coupled gate that is capacitively coupled to one of the thyristor base portions;

depositing an oxide material over the substrate, the transistor, the thin capacitively coupled gate and the thyristor portions;

etching a contact opening through the oxide material and to the emitter region formed in the opening;

forming a local interconnect electrically coupled to the exposed emitter region; and forming an electrical contact to a second one of the source/drain regions.

36. A method for forming a thyristor-based device having a thyristor structure with two base portions and a junction therebetween, the method comprising:

forming a semiconductor substrate having an upper surface;

forming a transistor having a gate over the upper surface and source/drain regions in the substrate below the upper surface; and forming a thyristor with a control port capacitively-coupled to one of the base portions and aligned with the junction.

* * * * *

UNITED STATES PATENT AND TRADEMARK OFFICE
CERTIFICATE OF CORRECTION

PATENT NO. : 6,653,174 B1
DATED : November 25, 2003
INVENTOR(S) : Cho et al.

It is certified that error appears in the above-identified patent and that said Letters Patent is hereby corrected as shown below:

Title page,
After Item [22], strike the subheader, "Related U.S. Application Data", and the four lines of text immediately following this subheader.
Item [56], References Cited, OTHER PUBLICATIONS,
"Baliga, B. Jayant, *Modern Power Devices*, pp. 349-350" should read
-- Baliga, B. Jayant, *Modern Power Devices*, pp. 349-350, 1987 --; and
"Plummer, James D. and Scharf, Brad W., *Insulated-Gate Planar Thyristors: I-Structure and Basis Operation*, pp. 380-386" should read
-- Plummer, James D. and Scharf, Brad W., *Insulated-Gate Planar Thyristors: I-Structure and Basis Operation*, pp. 380-386, 2/1980 --.

Column 1,
Lines 4-11, strike the subheader "RELATED PATENT DOCUMENTS", and the seven lines of text immediately following the subheader.
Line 63, "to i slow" should read -- to slow --.

Column 5,
Line 55, "N+source/drain" should read -- N+ source/drain --.

Column 6,
Lines 11 and 12, "P+regions" should read -- P+ regions --.
Line 12, "N+S/D" should read -- N+ S/D --.
Line 56, "P+emitter" should read -- P+ emitter --.
Line 65, "P+regions" should read -- P+ regions --.

Column 7,
Lines 2 and 7, "P+emitter" should read -- P+ emitter --.
Line 8, "devices;" should read -- devices, --.
Line 47, "N+material" should read -- N+ material --.
Line 49, "N+emitter" should read -- N+ emitter --.
Lines 50 and 62, "P+emitter" should read -- P+ emitter --.
Line 64, "P+polysilicon" should read -- P+ polysilicon --; and "P+material" should read -- P+ material --.

Column 8,
Line 13, "P+anode" should read -- P+ anode --.
Line 15, "P+poly" should read -- P+ poly --.
Line 24, "materal" should read -- material --; and "thndeposited" should read -- then deposited --.

UNITED STATES PATENT AND TRADEMARK OFFICE
CERTIFICATE OF CORRECTION

PATENT NO. : 6,653,174 B1
DATED : November 25, 2003
INVENTOR(S) : Cho et al.

It is certified that error appears in the above-identified patent and that said Letters Patent is hereby corrected as shown below:

Column 8,
Line 25, "mid" should read -- and --.
Line 29, "tic" should read -- the --.
Line 35, "mated al" should read -- material --.
Line 37, "N+emitter" should read -- N+ emitter --.
Line 38, "P+emitter" should read -- P+ emitter --.
Line 40, "bass" should read -- base --.
Line 43, "further, because" should read -- further because --.
Line 57, "N+emitter" should read -- N+ emitter --.
Line 58, "P+emitter" should read -- P+ emitter --.

Column 9,
Line 6, "N+emitter" should read -- N+ emitter --.
Line 10, "N+polysilicon" should read -- N+ polysilicon --.
Line 12, "N+cathode" should read -- N+ cathode --.
Line 25, "P+either in situ" should read -- P+ either *in situ* --.
Line 26, "P+implant" should read -- P+ implant --; and "P+emitter/local" should read -- P+ emitter/local --.
Line 34, "N+emitter" should read -- N+ emitter --.
Line 36, N+doping" should read -- N+ doping --.
Line 37, "N+emitter" should read -- N+ emitter --.
Lines 59 and 60, "N+region" should read -- N+ region --.

Column 10,
Lines 4, 5 and 8, "P+emitter" should read -- P+ emitter --.
Line 24, "N+emitter" should read -- N+ emitter --.

UNITED STATES PATENT AND TRADEMARK OFFICE
CERTIFICATE OF CORRECTION

PATENT NO. : 6,653,174 B1
DATED : November 25, 2003
INVENTOR(S) : Cho et al.

It is certified that error appears in the above-identified patent and that said Letters Patent is hereby corrected as shown below:

Column 11,
Line 49, "MOSPET" should read -- MOSFET --.
Line 57, "selfaliining" should read -- self-aligning --.

Column 12,
Line 25, "frowning" should read -- forming --.

Column 13,
Line 1, "frowning" should read -- forming --.

Column 14,
Line 5, "capacitivcly" should read -- capacitively --.

Signed and Sealed this

Seventeenth Day of August, 2004

JON W. DUDAS
*Acting Director of the United States Patent and Trademark Office*